(12) United States Patent
Joshi et al.

(10) Patent No.: US 6,285,082 B1
(45) Date of Patent: Sep. 4, 2001

(54) SOFT METAL CONDUCTOR

(75) Inventors: Rajiv Vasant Joshi; Manu Jamnadas Tejwani, both of Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/367,565

(22) Filed: Jan. 3, 1995

(51) Int. Cl.[7] ................................................ H01L 23/48
(52) U.S. Cl. ......................... 257/750; 257/762; 257/763
(58) Field of Search ..................................... 257/760, 751, 257/762, 763, 765, 750

(56) References Cited

U.S. PATENT DOCUMENTS 4,990,410   2/1991   Saitoh et al. ........................ 428/547
5,345,108 * 9/1994   Kikkawa ............................. 257/751

FOREIGN PATENT DOCUMENTS 472733   6/1992   (JP).
629405   4/1994   (JP).

OTHER PUBLICATIONS

Journal of Vacuum Science and Technology, Part A, vol. 5, No. 4, Jul., 1987–Aug. 1987, New York US, pp. 2088–2091, XP002005739 T. Kobayashi et al.

* cited by examiner

Primary Examiner—Roy Potter
(74) Attorney, Agent, or Firm—Robert M. Trepp; Randy W. Tung

(57) ABSTRACT

A soft metal conductor for use in a semiconductor device that has an upper-most layer consisting of grains having grain sizes sufficiently large so as to provide a substantially scratch-free surface upon polishing in a subsequent chemical mechanical polishing step.

20 Claims, 3 Drawing Sheets

SOFT METAL CONDUCTOR

FIELD OF THE INVENTION

The present invention generally relates to a soft metal conductor for use in a semiconductor device and a method of making such conductor and more particularly, relates to a soft metal conductor that has improved hardness in its surface layer for use in a semiconductor device wherein the surface layer consists of metal grains having grain sizes sufficiently large so as to provide a substantially scratch-free surface upon polishing in a subsequent chemical mechanical polishing step.

BACKGROUND OF THE INVENTION

Metal films have been utilized in semiconductor manufacturing to electrically connect together various components formed on a semiconductor wafer. For instance, vias, interconnects, trenches are just a few examples of such applications. Elemental aluminum and its alloys such as aluminum-copper have been used traditionally for these applications. The advantages of using aluminum and its alloys include the low resistivity, the superior adhesion to $SiO_2$, the ease of patterning, the high purity and low cost of the materials.

Aluminum and aluminum alloys are not without drawbacks when utilized in semiconductor technology. Two of these drawbacks are the softness of the materials which results in difficulty in polishing and the electromigration phenomenon which results in circuit failure. For instance, the polishing problem has been observed in a process where metal films or metal conductive lines are formed in a damascene process by first filling troughs previously etched in an insulator with a metal and then polishing away metal deposited between the troughs. When a soft metal is used, i.e. aluminum, copper or aluminum-copper alloy, the surface of the metal lines may become scratched in a polishing process. The formation of defects during polishing of scratches, pockets, depressions or erosions in the metal surface significantly increases the line resistance and thus reduces the yield of the semiconductor manufacturing process.

In order to avoid these defects produced in the polishing process of soft metals, capping by hard layers has been tried by others to improve the wear resistance of the surface layer of the metal. However, this is achieved at the expense of higher capacitance as the line thickness increases. It is inherently difficult to improve the hardness of soft metals which requires the processing steps of polishing. Poor polishing results in variations in the line or via resistance.

It is therefore an object of the present invention to provide a soft metal conductor that has improved hardness in its upper-most surface and a method of making the same without the shortcomings of the prior art conductors and the prior art methods.

It is another object of the present invention to provide a soft metal conductor that has improved hardness in its upper-most surface such that a substantially scratch-free surface can be obtained after polishing in a chemical mechanical polishing process.

It is a further object of the present invention to provide a soft metal conductor that has improved hardness in its upper-most surface by simply modifying the processing conditions of the deposition process for the soft metal.

It is yet another object of the present invention to provide a soft metal conductor that has a substantially scratch-free surface upon polishing by depositing a soft metal layer consisting of metal grains having large grain sizes in its upper-most layer.

It is another further object of the present invention to provide an electrically conducting soft metal structure that has a substantially scratch-free surface upon polishing by depositing in the upper-most layer of said structure grains of soft metal not smaller than about 200 nm.

It is still another object of the present invention to provide an electrically conducting soft metal structure that has a substantially scratch-free surface upon polishing for use in a semiconductor device by depositing in the upper-most layer of said structure metal grains having grain sizes not smaller than about 20% of the thickness of the soft metal structure.

It is still another further object of the present invention to provide an electrically conducting soft metal structure that has a substantially scratch-free surface upon polishing for use in a semiconductor device wherein the surface has a layer of at least about 100 nm in thickness of large grain size metal grains deposited therein.

It is yet another further object of the present invention to provide a method of making a soft metal conductor that has a substantially scratch-free surface upon polishing for use in a semiconductor device by a physical vapor deposition or a chemical vapor deposition technique.

SUMMARY OF THE INVENTION

In accordance with the present invention, a soft metal conductor that has a substantially scratch-free upper-most surface upon polishing for use in a semiconductor device and a method of making the same is provided.

In the preferred embodiment, the soft metal conductor is provided by depositing an upper-most layer of the conductor consisting of grains having grain sizes not smaller than about 20% of the thickness of the soft metal conductor. This is achieved by, for instance, depositing an upper-most layer of the soft metal material to a thickness of not less than 100 nm with grains of soft metal not less than 200 nm in grain sizes. The large grains provide a significantly improved hardness in the upper-most layer of the soft metal conductor such that a substantially scratch-free surface upon polishing in a subsequent chemical mechanical polishing process is obtained. By substantially scratch-free, it is meant that a surface is obtained after polishing that has less than five scratches per square centimeter area.

In an alternate embodiment, a layer of soft metal having smaller grains, i.e. a grain size of not larger than 50 nm is first deposited in the soft metal conductor to a thickness of not less than 600 nm, an upper-most layer of large grains having grain sizes not smaller than 200 nm is then deposited on top of the layer of small grains. The large grain size in the upper-most layer provides the desirable scratch-free surface for polishing, while the middle layer of soft metal in small grains provides a layer of material without the thermal voiding problem.

In another alternate embodiment, a layer of soft metal having small grains of less than 50 nm in size is sandwiched between a bottom layer and a top layer of metal consisting of grains of larger than 200 nm in size.

In yet another alternate embodiment, after a large grain soft metal M1 is deposited, a layer of Ti is sequentially deposited on top of the soft metal. The Ti layer deposited at the interface between the via and M1, M2 has a thickness of not higher than 30 nm so as to provide improved anti-electromigration property in the soft metal conductor after the Ti layer is converted to a TiAl$_3$ layer in a subsequently conducted annealing process at 400° C. M1, M2 are metal stacks of Ti/Al-Cu/Ti/TiN.

The present invention is also directed to a method of making a soft metal conductor that has a substantially scratch-free surface upon polishing by a multi-step deposition process, i.e., first sputtering at 450° C. for 10–15 sec, then at 400° C. for 2 min and followed by 450° C. for 15–20 sec. A soft metal conductor that has improved hardness in its upper-most surface can be obtained The present invention is further directed to a method of polishing soft metal by following a prescribed equation of processing parameters to obtain optimum volume removal without scratches and erosion.

The present invention is still further directed to a method of forming a substantially scratch-free surface on a soft metal conductor by first depositing a soft metal layer at a low deposition temperature and then annealing the soft metal layer at a higher temperature to increase the grain size of the metal.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED AND ALTERNATE EMBODIMENTS

The present invention provides an improved soft metal conductor for use in semiconductor devices that has a composite large/small grain structure with a greatly improved polishing capability. It is known that soft metals are susceptible to scratching or erosion when subjected to polishing. By increasing the grain size in the surface layer of the metal, the wear resistance of the soft metal is greatly improved. The improvement in wear resistance is by a factor of at least 4 to 5 compared to a standard structure.

Multi-layered grain structure can be achieved by a sputtering deposition process. For instance, a first layer is deposited at a high temperature for less than 30 sec, followed by a low temperature to fill the bulk of the lines or vias and finally, a deposition at a high temperature for less than 30 sec.

A structure and a method are disclosed to improve the wear resistance of soft, low resistivity metals such as aluminum, aluminum-copper, copper, etc. The method achieves a multi-layered grain structure in one deposition cycle. The sequence of the layering can be as follows: (1) large grains, (2) small grains, and (3) large grains. The bottom and the top layers act as polishing stops, while the middle layer deposited at low temperature helps to prevent thermal voiding. Since the material is homogeneous, there is no loss of resistance. The structure is achieved in one deposition cycle, i.e. depositing at high temperature for a thickness of 100–200 nm, then depositing 700–800 nm thickness at low temperature and low pressure, and finally depositing a thickness of 100–200 nm at high temperature. The deposition time and temperature can be adjusted so that the thermal budget is well below the voiding temperature. The multi-layered grain structure can also be achieved by the rapid thermal annealing (RTA) of these layers. For instance, smaller grains formed at about 100–300° C. may be annealed at 400° C. for a length of time sufficient to grow the small grains into grains larger than 200 nm in grain size.

Multi-layered grain structure is created by using PVD and CVD processes and subsequent annealing techniques in dual and single damascene/reactive ion etching (RIE) structures according to a prescribed relationship for chemical mechanical polishing. The following are examples of various structures and the associated experimental processes.

EXAMPLE 1

Figure 1:
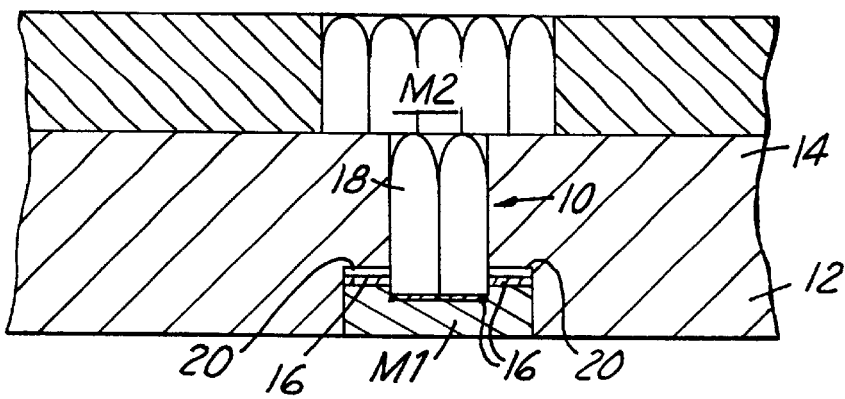
FIG. 1 is a graph illustrating a present invention soft metal conductor in a dual damascene structure as deposited.

Example 1 illustrates the formation of a dual damascene via structure by the present invention method. A dry etch method, reactive ion etching (RIE) is first used to clean the interface before an aluminum-copper deposition. As shown in FIG. 1, a via structure 10 is formed on top of already reactively ion etched layer of Ti/Al-Cu/Ti shown as M1 in FIG. 1. An oxide layer 12 or any other low dielectric constant inorganic or organic layer is deposited and planarized by chemical mechanical polishing by using colloidal silica. Additional oxide 14 is deposited and then patterned for the lines and vias. The lines are then opened up by using the RIE technique. The RIE technique is an important step used to remove all non-Al-Cu layers on top of the already formed M1 layer. A PVD process is then used to deposit a layer 16 of Ti of less than 30 nm, a layer 20 of TiN, a layer 18 of Al-Cu, and a final layer of Ti/TiN sequentially. The Al-Cu layer deposition is achieved by producing metal grains having grain sizes of at least about 20% of the thickness of the soft metal layer. The structure is then chemically polished using slurry containing silica particles and low pressure to form interconnects and vias in one step.

Figure 2:
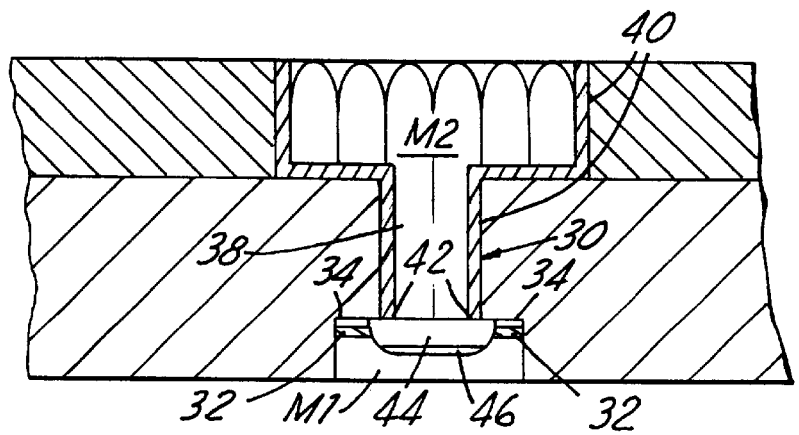
FIG. 2 is a graph illustrating the present invention soft metal conductor in a final dual damascene structure with the formation of TiAl$_3$ at the interface.

A second method of using a wet etch method to clean the interface before the Al-Cu deposition for a dual damascene structure is shown in FIG. 2. In this via structure 30, buffered HF (10:1) is first used to clean the Ti/TiN layers 32 and 34 on top of the M1 layer. As a result, an encroached structure with the Ti layer 32 forming a TiAl$_3$ layer during subsequent annealing at 400° C. for 30 min is achieved. It should be noted that at the shoulder portions 42 of the wet etched area 44 in the M1 layer, the layer of Ti deposited is very thin and in some instances, almost non-existant. After depositing a second Ti/Al-Cu/Ti layer 38, the Ti layer 40 (which subsequently forms TiAl$_3$ after 400° C. annealing) is only under the via and does not encroach as shown in FIG. 2. The remaining processing steps for the Al-Cu deposition is the same as the example described above by using the dry etch method. The thickness of TiAl$_3$ layer 32 formed is between about 30 and about 60 nm except the area 46 directly under the via which is less than 30 nm.

EXAMPLE 2

Figure 3:
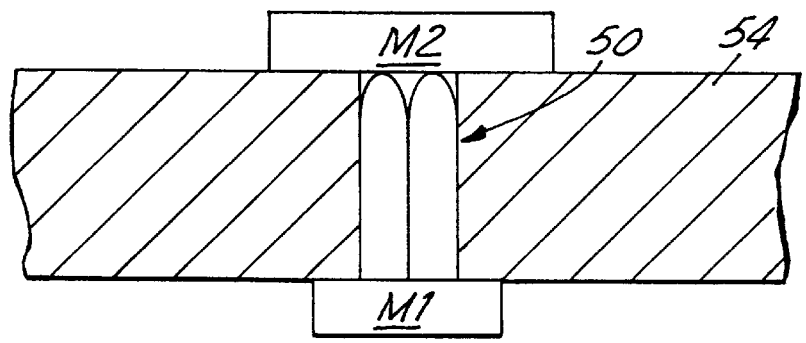
FIG. 3 is a graph illustrating the present invention soft metal conductor in a single damascene structure as deposited.
Figure 4:
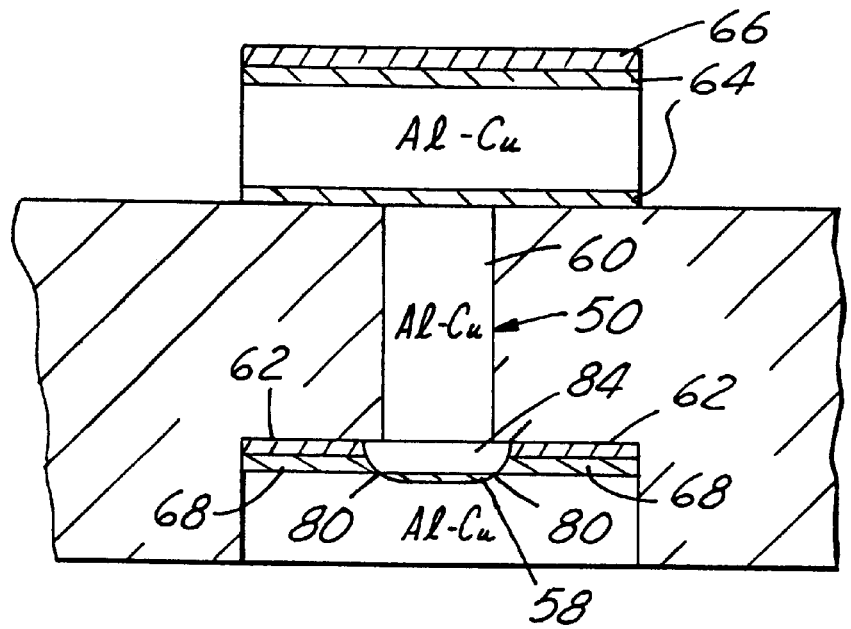
FIG. 4 is a graph illustrating a present invention soft metal conductor in a single damascene structure with the deposition of Ti and TiN layers at the interface.

A single damascene structure made by utilizing a dry etch RIE technique to clean the interface before the Al-Cu deposition is shown in FIG. 3. The via structure SO is formed on top of already reactively ion etched M1 layer of Ti/Al-Cu/Ti. An oxide or other low dielectric constant inorganic or organic layer 54 is deposited and planarized by chemical mechanical polishing using colloidal silica. The oxide layer 54 is patterned for via 50. A first via is opened up using the RIE technique. An important step is to use RIE to remove all non-Al-Cu layers on top of the already formed M1 layer. A PVD process is then used to form a first Ti layer 58 generally of a thickness of less than 30 nm and Ti layer 68 generally of a thickness between about 30 nm to about 60 nm, and then a layer 60 of Al-Cu. This is shown in FIG. 4. The Ti layers 58 and 68 subsequently forms $TiAl_3$ after annealing at 400° C. The Al-Cu layer deposition process is conducted resulting in a layer having grain sizes of at least about 20% of the thickness of the soft metal layer deposited. The via structure 50 is then chemically polished using a slurry loaded with silica particles and low pressure. A layer M2 is then deposited with a very thin Ti layer 64, i.e. less than 30 nm underneath, then patterned and reactively ion etched to form the interconnect structure. The top Ti layer 64 can be thicker than the bottom Ti layer 58. Layers 62 and 66 of TiN are formed as anti-reflective coatings for the photo-masking process.

It should be noted at the shoulder portions 80 of the wet etched cavity 84, the Ti film is very thin or almost non-existant. A continuous aluminum phase therefore exists at the shoulder portions 80. This further promotes the anti-electromigration characteristics of the present invention soft metal conductor.

Figure 5:
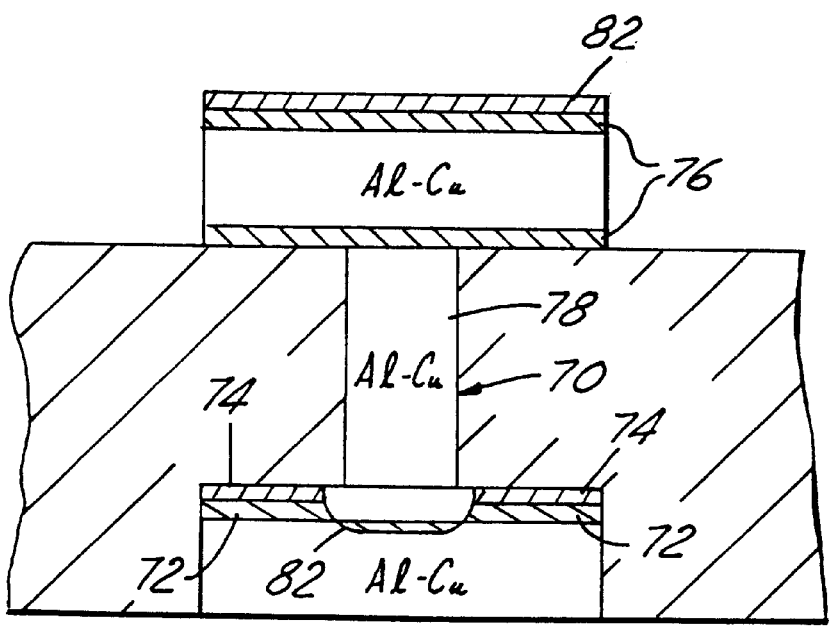
FIG. 5 is a graph illustrating a present invention soft metal conductor in a final single damascene structure with the formation of TiAl$_3$ at the interface.

A second method of forming a single damascene is the use of wet etch technique to clean the interface before the Al-Cu deposition. In the via structure 70 as shown in FIG. 5, buffered HF (50:1) is used to clean layers 72 and 74 of Ti and TiN on top of layer M1. As a result, an encroached structure was formed. After depositing layer 78 of Ti/Al-Cu/Ti, the Ti layer 82 (which subsequently forms $TiAl_3$ after annealing at 400° C. for 30 min) is only under the via and does not encroach to other areas as shown in FIG. 5. The remaining process for Al-Cu deposition is the same as described above in the dry etch method for single damascene. The encroachment allows the easy flux of Al-Cu under an electric field and thus improving the electromigration resistance of the structure.

The structures shown in FIGS. 1–5 were tested for electromigration resistance. To evaluate the electromigration characteristics of the two level structures, 1.4 -μm wide and 300 μm long Al-2% Cu lines connected by Al-Cu studs 1 μm in diameter were fabricated. Electromigration tests were carried out at a current density of 1.22 A/cm². A 20% resistance shift is used as a criterion for failure. The two level Al-Cu line/via structure was compared to a CVD formed W via/Al-Cu line structure. The mean time to failure for Al-Cu vias showed at least an order of magnitude of improvement over the mean time to failure for the CVD formed W stud.

A series of tests was conducted to verify the improvement in wear resistance of the soft metal conductors. For instance, aluminum and copper were deposited to create large grain structures using a sputtering process and the data obtained are shown in Table 1.

TABLE 1

| Sputtering Pressure mT | Target to work Distance cm | Grain Size μm | Yield* % | Sheet Resistance Ω/□ |
|---|---|---|---|---|
| 0.2 | 15 | 1.0 | 92 | 0.035 |
| 0.3 | 15 | 0.8 | 95 | 0.032 |
| 0.8 | 20 | 0.7 | 90 | 0.033 |
| 1.0 | 30 | 0.7 | 93 | 0.034 |

As shown in Table 1, large metal grains can be created by using short throw/long throw sputtering techniques. As a result, the yield increases dramatically while maintaining the sheet resistance.

It should be noted that in Table 1, the substrate temperature during the test was maintained at 30° C. In all cases, Al-Cu film thickness was kept at between 1 to 1.5 μm. The same tests were repeated for copper with similar results obtained. For the yield analysis, a comb-serpentine structure was used with a total line length of 50 cm. The sheet resistance data were measured on 50 sites per wafer. The aspect ratio of the vias filled is 3.

When the temperature of the deposition process is changed by in-situ or separate heating (by RTA or reflow process), the grain size can be further improved to achieve the wear/scratch resistance. These data are shown in Tables 2 and 3.

TABLE 2

| Sputtering Pressure mT | Target to work Distance cm | Grain Size μm | Yield* % | Sheet Resistance Ω/□ |
|---|---|---|---|---|
| 0.2 | 15 | 2.4 | 90 | 0.034 |
| 0.3 | 15 | 2.2 | 93 | 0.034 |
| 0.8 | 20 | 1.9 | 92 | 0.033 |
| 1.0 | 30 | 1.8 | 96 | 0.032 |
| 2.0 | 30 | 1.8 | 93 | 0.033 |

For Table 2, the substrate temperature during the tests is maintained at between 400–475° C. The yield analysis data is obtained by a comb-serpentine structure with a total line length of 50 cm. The average sheet resistance was measured based on 50 sites per wafer. The aspect ratio filled is 4.

TABLE 3

| Sputtering Pressure mT | Target to work Distance cm | Grain Size μm | Yield* % | Sheet Resistance Ω/□ |
|---|---|---|---|---|
| 0.8 | 15 | 2.9 | 89 | 0.035 |
| 1.0 | 15 | 2.7 | 94 | 0.034 |
| 2.0 | 15 | 2.4 | 87 | 0.034 |
| 3.0 | 15 | 2.8 | 87 | 0.034 |

The substrate temperature of samples shown in Table 3 are maintained at between 475~550° C. The yield analysis data were obtained by a comb-serpentine structure with a total line length of 50 cm. The average sheet resistance was measured based on 50 sites per wafer. The aspect ratio filled is 2.

It was discovered that when samples are heated up to the melting temperature or when converting the surface layer to large grains by using the rapid thermal annealing (RTA) technique, the wear/scratch resistance of the samples can be further improved. These data are shown in Table 4.

TABLE 4

| Sputtering Pressure mT | Target to work Distance cm | Grain Size μm | Yield* % | Sheet Resistance Ω/□ |
| --- | --- | --- | --- | --- |
| 1.0 | 15 | 3.2 | 96 | 0.033 |
| 2.0 | 15 | 3.3 | 90 | 0.033 |
| 3.0 | 15 | 3.4 | 96 | 0.034 |

As shown in Table 4, the films are deposited at three different pressures around 100° C. and then heated in a furnace at 580° C. for five minutes to fill metal into the contacts/trenches. In a separate experiment, the films were heated by using RTA technique at 600° C. for two minutes. The yield analysis data are obtained by a comb-serpentine structure with a total line length of 50 cm. An average sheet resistance is measured based on 50 sites per wafer. The aspect ratio filled is 2.

Two-step processes are also used for metals such as Al-Cu and Cu. First, metal is deposited at temperatures about 100–300° C. to fill high aspect ratio vias (i.e. 2 to 3). They are then heated to temperatures about 400° C. to increase the grain size. A polishing process is then performed to verify the increase in resistance to scratching.

Other deposition techniques, such as evaporation, collimation and CVD have also been used in the deposition of Al-Cu and Cu with similarly desirable results achieved.

All polishing experiments were carried out by using particles having various hardnesses in the slurry, e.g. $Al_2O_3$, silica and silicon nitride. The polishing processes were carried out by using a prescribed relationship to polish soft layers such as Al-Cu and Cu.

$$\frac{dV}{dt} = \frac{KAR_{pd}H_pV_cG_p}{H_mG_m}$$

Where p denotes particles in the slurry, m denotes soft metal, pd denotes pad and c denotes chuck or wafer holder. dV/dt is the rate at which metal volume is removed. H is the hardness, A is the area of the metal exposed, G is the grain size, R is the roughness, K is a constant that depends on chemical bonds between particles, metal, pads and pH factor, etc., $V_g$ is the speed of the chuck.

Figure 6:
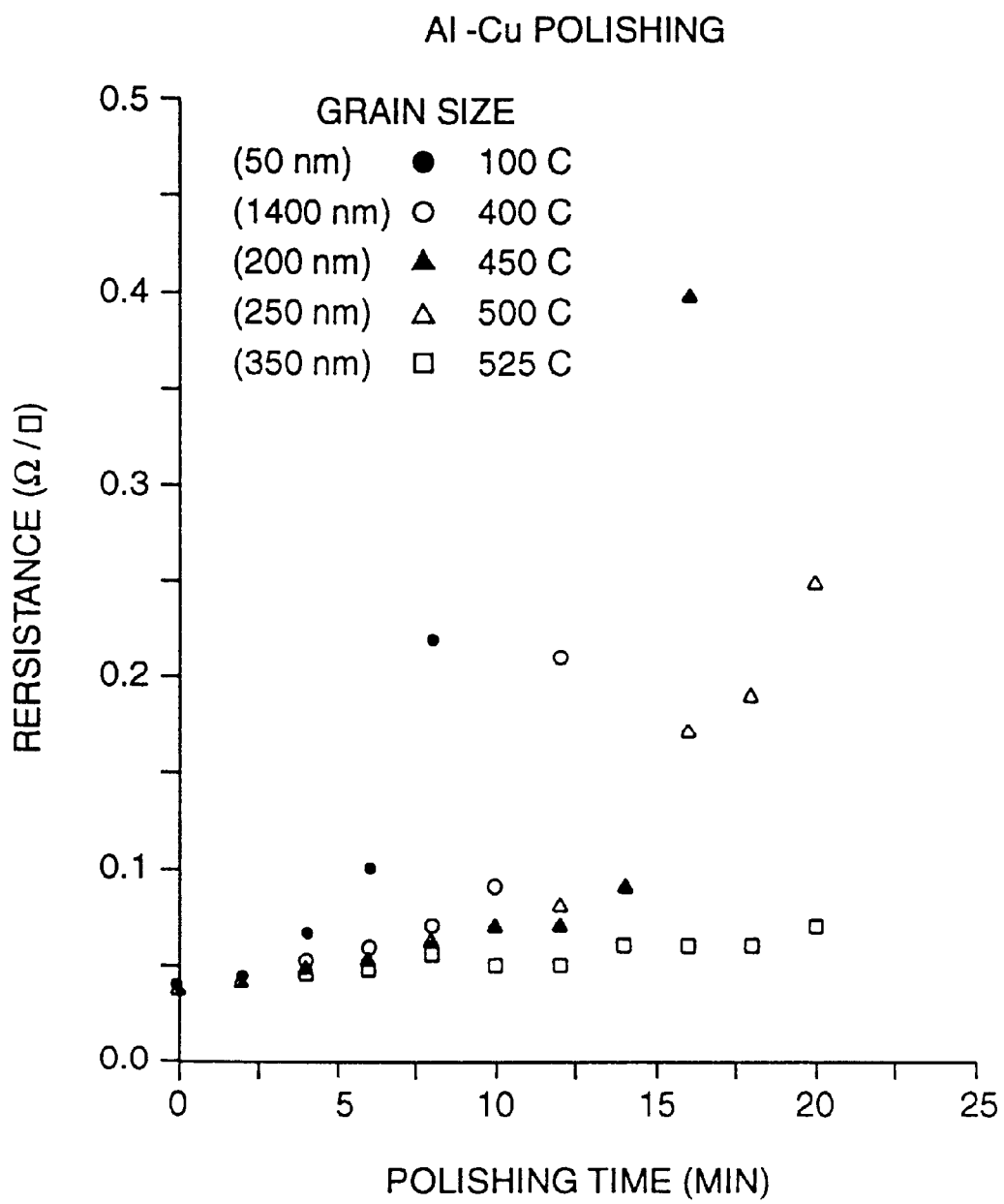
FIG. 6 is a graph illustrating the dependence of surface resistance on polishing time for surfaces having various grain sizes.

A graph of the resistance data plotted against polishing time for soft metals having various grain sizes is shown in FIG. 6. A first layer with homogeneous grain structure is created and the wear resistance is evaluated and compared against a standard Al-Cu structure. The polishing rates, as shown in FIG. 6, are obtained for structures with homogeneous grain structures. An unexpected result is obtained which shows the larger the grain size, the larger is the wear resistance of the soft metal. A combination of these multi-layered grain structure is formed and polished to form the vias.

While the present invention has been described in an illustrative manner, it should be understood that the terminology used is intended to be in the nature of words of description rather than of limitation.

Furthermore, while the present invention has been described in terms of a preferred embodiment thereof, it is to be appreciated that those skilled in the art will readily apply these teachings to other possible variations of the invention.

The embodiments of the invention in which an exclusive property or privilege are claimed are defined as follows:

1. A soft metal conductor comprising an upper-most layer consisting of grains capable of providing a substantially scratch-free planar surface upon polishing in a subsequent chemical mechanical polishing step, said soft metal is selected from the group consisting of Al, Cu, Ag, binary and ternary alloys of Al, Cu and Ag.

2. A soft metal conductor having improved hardness in its upper-most layer for use in a semiconductor device wherein said upper-most layer consists of grains having grain sizes not smaller than about 20% of the thickness of said soft metal conductor, said soft metal is selected from the group consisting of Al, Cu, Ag, binary and ternary alloys of Al, Cu and Ag.

3. A soft metal conductor according to claim 2, wherein said conductor is a member selected from the group consisting of a via, an interconnect and a line.

4. A soft metal conductor according to claim 2, wherein said upper-most layer consisting of grains of metal not less than 200 nm in grain size.

5. An electrically conducting soft metal structure for use in a semiconductor device comprising:
   an upper-most layer consisting of grains having grain sizes not smaller than about 20% of the thickness of said soft metal structure,
   a second layer contiguous with and immediately adjacent to said upper-most layer consisting of grains having grain sizes not larger than about 20% of the thickness of said soft metal structure, and
   said soft metal in said soft metal structure is selected from the group consisting of Al, Cu, Ag, binary and ternary alloys of Al, Cu and Ag.

6. An electrically conducting soft metal structure according to claim 5, wherein said upper-most layer having a thickness sufficiently large to provide a substantially scratch-free and erosion-free surface upon polishing in a chemical mechanical polishing method.

7. An electrically conducting soft metal structure according to claim 5, wherein said structure being made of a metal selected from the group consisting of aluminum, copper, silver, ternary and binary alloys of aluminum, copper, silver and any other low resistance metal.

8. An electrically conducting soft metal structure according to claim 5, wherein said structure being a member selected from the group consisting of a via, an interconnect and a line.

9. An electrically conducting soft metal structure according to claim 5, wherein said upper-most layer having grains of metal not less than 200 nm in grain size and a thickness of at least 100 nm.

10. An electrically conducting soft metal structure according to claim 5, wherein said upper-most layer having grains of metal not less than 200 nm in grain size and said second layer having grains of metal not more than 100 nm in grain size.

11. An electrically conducting soft metal structure according to claim 5, wherein said second layer having grains of metal not more than 100 nm in grain size and a thickness of not less than 600 nm.

12. An electrically conducting soft metal structure according to claim 5 further comprising a bottom layer contiguous with and immediately adjacent to said second layer, said bottom layer consisting of grains of metal not less than 200 nm in grain size.

13. A soft metal conductor for use in a semiconductor device comprising:
   a first soft metal layer selected from the group consisting of aluminum copper, silver binary and ternary alloys of aluminum, copper and silvers a first Ti layer of less than 30 nm thick on top of said first soft metal layer, a second soft metal layer on top of said first Ti layer having in its upper-most surface metal grains of grain sizes not smaller than about 20% of the thickness of said second soft metal layer, said second soft metal is selected from the group consisting of Al, Cu, Ag, binary and ternary alloys of Al, Cu and Ag, and a second Ti layer on top of said second soft metal layer;

whereby at least said first Ti layer sandwiched between two soft metal layers is converted to $TiAl_3$ upon annealing at a temperature higher than room temperature such that diffusion of atoms of said soft metal through said $TiAl_3$ film occurs upon the passage of an electrical current therethrough and thus improving the electromigration resistance of said soft metal conductor.

14. A soft metal conductor according to claim 13, wherein said second Ti layer has a thickness of less than 30 nm.

15. A soft metal conductor according to claim 13, wherein said first Ti layer is situated at the bottom of a via having portions of said layer in extremely small thickness or portions of said layer in voids so as to allow the existance of a continuous phase of said soft metal material or diffusion of said soft metal atoms across a $TiAl_3$ layer subsequently formed and a resulting improvement in the electromigration resistance of said soft metal conductor.

16. A soft metal conductor according to claim 13, further comprising an annealing step at a predetermined temperature and for a predetermined length of time sufficient to convert at least said first Ti layer to $TiAl_3$ when said soft metal used is Al or Al-Cu.

17. A soft metal conductor according to claim 16, wherein said predetermined temperature is not less than 300° C. and said predetermined length of time is not less than 10 min.

18. A soft metal conductor according to claim 16, wherein said predetermined temperature is 400° C. and said predetermined length of time is 30 min.

19. A soft metal conductor according to claim 13, wherein said first Ti layer further comprising a TiN layer or other refractory metal nitride layer.

20. A soft metal conductor according to claim 13, wherein said first Ti layer further comprising a TiN layer or other refractory metal nitride layer having a thickness of less than 30 nm.

\* \* \* \* \*